United States Patent
Marukame et al.

(10) Patent No.: US 8,681,034 B2
(45) Date of Patent: Mar. 25, 2014

(54) ANALOG-TO-DIGITAL CONVERTER FOR DIVIDING REFERENCE VOLTAGE USING PLURAL VARIABLE RESISTORS

(75) Inventors: Takao Marukame, Tokyo (JP); Tetsufumi Tanamoto, Kanagawa (JP); Atsuhiro Kinoshita, Kanagawa (JP); Tomoaki Inokuchi, Kanagawa (JP); Masamichi Suzuki, Tokyo (JP); Yoshiaki Saito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/536,085

(22) Filed: Jun. 28, 2012

(65) Prior Publication Data

US 2013/0076550 A1 Mar. 28, 2013

(30) Foreign Application Priority Data

Sep. 22, 2011 (JP) ................. 2011-206961

(51) Int. Cl.
 *H03M 1/34* (2006.01)
(52) U.S. Cl.
 USPC .......................... 341/158; 341/155
(58) Field of Classification Search
 USPC .................. 341/155, 154, 169, 170, 172, 159
 See application file for complete search history.

(56) References Cited

U.S. PATENT DOCUMENTS

| | | | |
|---|---|---|---|
| 4,939,518 A * | 7/1990 | Hotta et al. .................... | 341/159 |
| 5,451,839 A * | 9/1995 | Rappaport et al. ............ | 375/224 |
| 6,373,423 B1 * | 4/2002 | Knudsen ....................... | 341/159 |
| 6,436,526 B1 | 8/2002 | Odagawa et al. | |
| 6,959,258 B2 * | 10/2005 | Smith et al. ................... | 702/132 |
| 7,999,628 B2 * | 8/2011 | Miyashita ..................... | 331/176 |
| 8,410,966 B2 * | 4/2013 | Nadimpalli et al. .......... | 341/153 |
| 8,456,237 B2 * | 6/2013 | Huang et al. .................. | 330/282 |

FOREIGN PATENT DOCUMENTS

| | | |
|---|---|---|
| JP | 08-79081 | 3/1996 |
| KR | 2001-0007428 | 1/2001 |

OTHER PUBLICATIONS

Notice of Preliminary Rejection issued by the Korean Intellectual Property Office on Aug. 19, 2013, for Korean Patent Application No. 10-2012-70805, and English-language translation thereof.

* cited by examiner

*Primary Examiner* — Peguy Jean Pierre
(74) *Attorney, Agent, or Firm* — Finnegan, Henderson, Farabow, Garrett & Dunner, L.L.P.

(57) ABSTRACT

According to an embodiment, an analog-to-digital converter includes a voltage generating unit, and a plurality of comparators. The voltage generating unit is configured to divide a reference voltage by a plurality of variable resistors to generate a plurality of comparative voltages. Each of the plurality of comparator is configured to compare any one of the plurality of comparative voltages with an analog input voltage and output a digital signal based on a result of a comparison between the comparative voltage and the analog input voltage. Each of the plurality of variable resistors includes a plurality of variable resistive elements that are connected in series, and each of the plurality of variable resistive elements has a resistance value that is variably set according to an external signal.

7 Claims, 10 Drawing Sheets

| INPUT | | $2^2$ | $2^1$ | $2^0$ | OUTPUT |
|---|---|---|---|---|---|
| DECIMAL | BINARY | | | | |
| 0 | 000 | 4 | 2 | 1 | 7 |
| 1 | 001 | 4 | 2 | 2 | 8 |
| 2 | 010 | 4 | 4 | 1 | 9 |
| 3 | 011 | 4 | 4 | 2 | 10 |
| 4 | 100 | 8 | 2 | 1 | 11 |
| 5 | 101 | 8 | 2 | 2 | 12 |
| 6 | 110 | 8 | 4 | 1 | 13 |
| 7 | 111 | 8 | 4 | 2 | 14 |

ANALOG-TO-DIGITAL CONVERTER FOR DIVIDING REFERENCE VOLTAGE USING PLURAL VARIABLE RESISTORS

CROSS-REFERENCE TO RELATED APPLICATION(S)

This application is based upon and claims the benefit of priority from Japanese Patent Application No. 2011-206961, filed on Sep. 22, 2011; the entire contents of which are incorporated herein by reference.

FIELD

Embodiments described herein relate generally to an analog-to-digital converter.

BACKGROUND

Analog-to-digital converters (AD converters) are roughly classified into three types of a successive-approximation type, a parallel comparison type, and a delta sigma (ΔΣ) type. Of these, the parallel comparison type is also called a flash type, and can obtain a digital value in a single comparison using ($2^n-1$) comparative voltages and ($2^n-1$) comparators for dividing a full scale of the analog signal into $2^n$ sections. For this reason, a parallel comparison type AD converter operates at highest speed.

However, the parallel comparison type is known to have a problem that a circuit size is large. The reason is as follows. An AD converter includes three basic elements of a resistor ladder for generating a comparative voltage, a comparator group, and an encoder. The conversion accuracy of the AD converter is determined depending on the accuracy of the resistor ladder and the resolution of the comparator, and the accuracy or the resolution is improved as the circuit area increases.

That is, in the parallel comparison type, the circuit size increases in exchange for an improvement in the conversion accuracy. In other words, it is difficult to achieve high resolution with a small circuit area.

In order to achieve high resolution, it is necessary to improve voltage dividing accuracy of the resistor ladder. Generally, the accuracy of the resistor ladder depends on the accuracy of a semiconductor microfabrication technique. As a method of avoiding this, a method is used in which resistive fuses (variable resistors) are formed together with a resistor ladder, and a resistance value is adjusted by burning the resistive fuses off one by one by laser irradiation before shipment.

However, as resolution increases, a circuit size increases. Accordingly, in the above method, when the circuit operates connected with another circuit in the form of an SOC (system on chip), it is difficult to adjust a resistance value one by one. For this reason, the resolution of the AD converter is eventually limited to a range of the accuracy of a semiconductor microfabrication technique. Further, once the resistive fuse is burned off, it is impossible to adjust the resistance value after that. Thus, the voltage dividing accuracy of the resistor ladder is hardly improved.

DETAILED DESCRIPTION

According to an embodiment, an analog-to-digital converter includes a voltage generating unit, and a plurality of comparators. The voltage generating unit is configured to divide a reference voltage by a plurality of variable resistors to generate a plurality of comparative voltages. Each of the plurality of comparator is configured to compare any one of the plurality of comparative voltages with an analog input voltage and output a digital signal based on a result of a comparison between the comparative voltage and the analog input voltage. Each of the plurality of variable resistors includes a plurality of variable resistive elements that are connected in series, and each of the plurality of variable resistive elements has a resistance value that is variably set according to an external signal.

Hereinafter, embodiments of an analog-to-digital converter (referred to as an "AD converter" in the following description) according to an embodiment will be described in detail with reference to the accompanying drawings.

Figure 1:
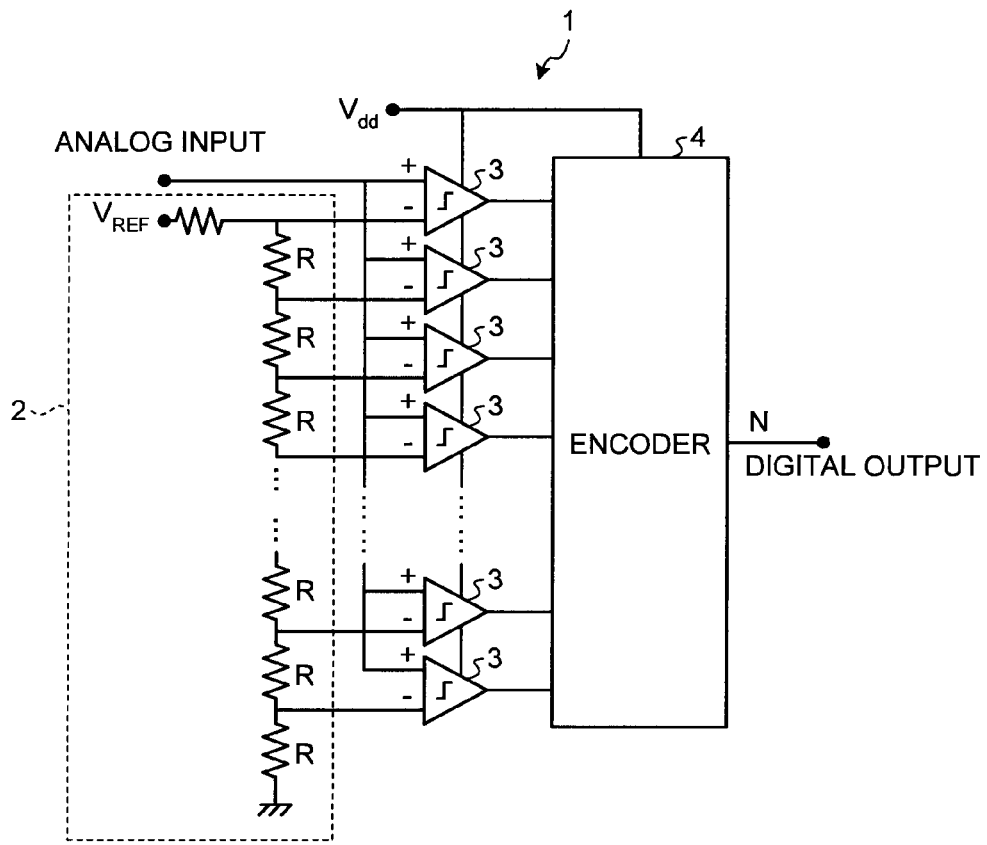
FIG. 1 is a diagram illustrating an AD converter of a parallel comparison type.

An AD converter of the embodiment is an AD converter of a parallel comparison type (flash type). First, the principle and the resolution of an AD converter 1 of the parallel comparison type in FIG. 1 will be described. As illustrated in FIG. 1, the AD converter 1 includes a voltage generating unit 2, a plurality of comparators 3, and an encoder 4. The voltage generating unit 2 includes a plurality of resistors R (a resistor ladder) which are connected in series. The voltage generating unit 2 generates a plurality of comparative voltages by dividing an externally applied reference voltage $V_{REF}$ by the resistor ladder. The plurality of comparative voltages generated by the voltage generating unit 2 is input to the corresponding comparators 3. An analog input signal (an input voltage) is commonly input to the comparators 3. Each of the comparators 3 compares the input comparative voltage with the analog input voltage and outputs a digital signal to the encoder 4 based on a result of a comparison between the comparative voltage and the analog input voltage. The encoder 4 outputs a digital value obtained by encoding the digital signals output from the comparators 3.

The number of the resistors R and the comparators 3 are partially illustrated in FIG. 1. As the number of the resistors R and the comparators 3 increase, the resolution is improved. In terms of an improvement in the conversion accuracy of the AD converter, it is desirable for the AD converter to have the resolution of 10 bits or more. However, for the convenience of description, an AD converter with the resolution of a low bit may be described below as an example.

Figure 2:
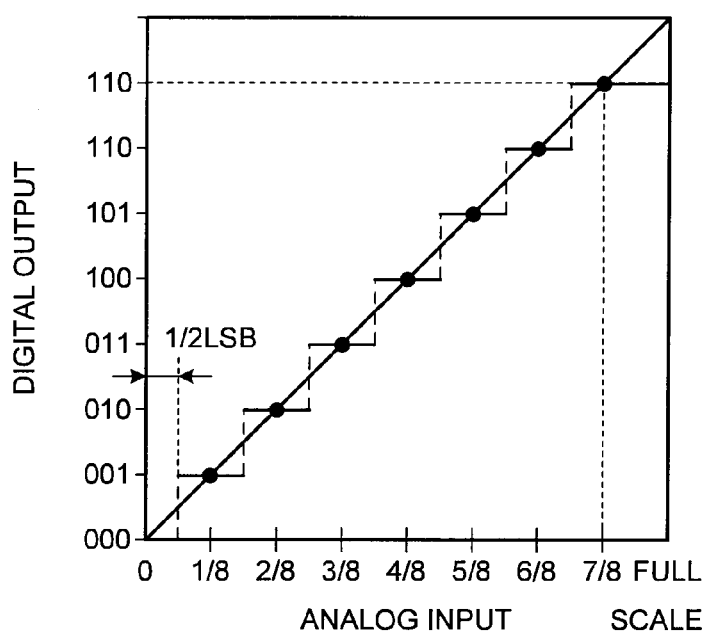
FIG. 2 is a diagram illustrating an input/output (I/O) characteristic of an AD converter.

An integer value derived from a value obtained by equally dividing the range of the reference voltage $V_{REF}$ (into 256 in case of 8 bits and 1024 in case of 10 bits) is read as an output value (a converted digital value) from the AD converter 1. Further, "$V_{REF}$" or "$\pm V_{REF}$" may be applied as the reference voltage. When "$V_{REF}$" is applied, a value obtained by dividing "$V_{REF}$" by 2N (N represents the number of bits of an output value) (namely, $V_{REF}/2N$) corresponds to the height of one step in a step-like input/output (I/O) characteristic illustrated in FIG. 2 ($2V_{REF}/2N$ when "$\pm V_{REF}$" is applied). In this case, the number of steps is "$2^N-1$". For example, in case of 3 bits, the analog input voltage is divided into 8 ($=2^3$), and the number of steps is 7 as illustrated in FIG. 2. Levels of voltages including a zero voltage are output as the digital values. When a minimum voltage unit is used as an LSB (least significant bit), only an LSB has a range of a ½ LSB. The LSB originally refers to a least significant digit of a binary number. On the other hand, a most significant digit of a binary number is referred to as an MSB. The AD converter 1 compares the analog input voltage with each of the divided voltages obtained by dividing the reference voltage $V_{REF}$ by the resistor ladder to thereby obtain thermometer codes as outputs of the comparators, and converts the thermometer codes into a binary code through the encoder 4, and outputs the binary code (a digital output).

The accuracy of the AD converter 1 is determined depending on the accuracy of a voltage comparison performed by each comparator 3. For example, in case of 8 bits, an interval between the comparative voltages output from the resistor ladder to which "$\pm V_{REF}=\pm 0.5 V$" is applied is a small value of 4 mV. A maximum value of a step-like voltage error needs to be suppressed to be 2 mV (½ LSB) or less. In case of using a CMOS technique, the resistor ladder is generally fabricated on a field (an insulating portion such as $SiO_2$ of a LOCOS or an STI) of an Si substrate using a poly crystalline silicon. In order to increase the processing accuracy, a dummy resistor may be formed at the position close to the resistor ladder. Further, a Joule heat by a resistor may affect a differential non-linear error (DNL) or an integral non-linear error (INL). In order to avoid influence of heat generated from a substrate, there is no problem if a variable resistor is formed not on an FEOL (front end of line) layer of an Si substrate but on a BEOL (back end of line) layer on an interlayer insulating film.

When there is influence of the DNL, the step-like line (a line representing the I/O characteristic) of FIG. 2 is horizontally shifted. An integration of the influence of the DNL results in a form, called the INL, in which all portions undulate in the step form. Typically, the AD converter 1 needs to be fabricated to achieve the high resolution and suppress influence of the DNL and the INL to be a ½ LSB or less. Further, the accuracy or stability of the reference voltage $V_{REF}$ has large influence on reliability of a value of the AD converter. Thus, in the embodiment, it is assumed that, for example, a bandgap reference voltage generally used as a reference voltage in a CMOS circuit is used, and the high accuracy in which an error is 1 bit or less is secured for the reference voltage $V_{REF}$.

As described above, the performance of the parallel comparison type AD converter is determined depending on the accuracy of the input voltage. Particularly, the voltage dividing accuracy of the resistor ladder is important in order to achieve the high resolution. In this regard, in the embodiment, the resistor ladder is configured with a plurality of variable resistors each having a resistance value variably set according to an external signal. A specific description will be made below.

Figure 3:
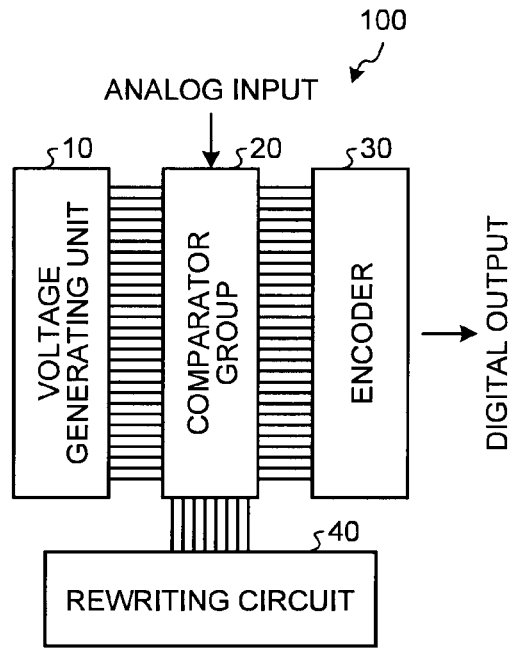
FIG. 3 is a diagram illustrating a schematic configuration example of an AD converter according to an embodiment.

FIG. 3 is a block diagram illustrating a schematic configuration example of an AD converter 100 according to the embodiment. As illustrated in FIG. 3, the AD converter 100 includes a voltage generating unit 10, a comparator group 20, an encoder 30, and a rewriting circuit 40. Here, an example in which the AD converter 100 includes the rewriting circuit 40 will be described, but the AD converter 100 is not limited to this configuration. For example, the AD converter 100 may not include the rewriting circuit 40. In this case, a package chip of the AD converter 100 may include terminals to be connected with the voltage generating unit 10, the comparator group 20, the encoder 30, and the rewriting circuit 40. This allows the AD converter to be connected with the rewriting circuit 40 through the terminals even after the AD converter 100 is fabricated, and thus resistance adjustment which will be described later can be flexibly performed.

Figure 4:
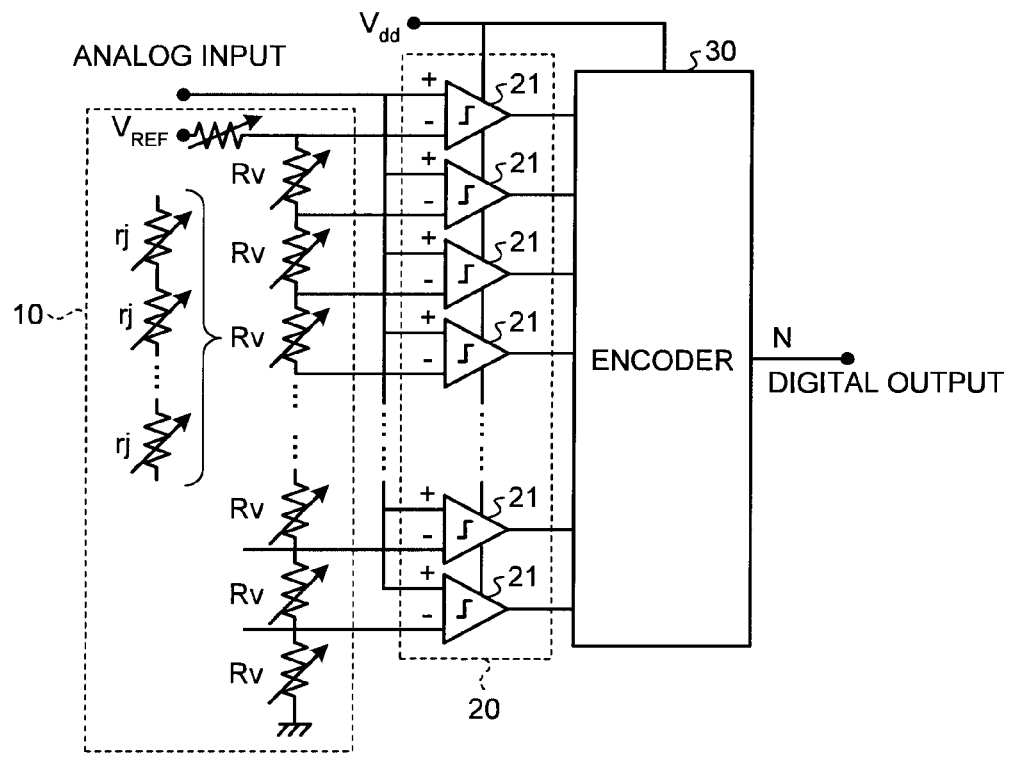
FIG. 4 is a diagram for describing a detailed configuration of the AD converter.

FIG. 4 is a diagram for describing a detailed configuration of the AD converter 100. In FIG. 4, the rewriting circuit 40 is not illustrated. As illustrated in FIG. 4, the voltage generating unit 10 includes a plurality of variable resistors Rv which are connected in series. The voltage generating unit 10 divides an externally applied reference voltage $V_{REF}$ by using a plurality of variable resistors Rv to thereby generate a plurality of comparative voltages. Each of the variable resistor Rv includes a plurality of variable resistive elements rj which are connected in series. Each of the variable resistive elements rj has a resistance value which is variably set according to an external signal. The details will be described later.

The comparator group 20 illustrated in FIG. 3 includes a plurality of comparators 21. A plurality of comparative voltages generated by the voltage generating unit 10 is input to the corresponding comparators 21. An analog input signal (an input voltage) is commonly input to the comparators 21. Each of the comparators 21 compares the input comparative voltage with the analog input voltage, and outputs a digital signal to the encoder 30 based on the comparison result. The encoder 30 outputs a digital value obtained by encoding the digital signals output from the comparators 21. A drive voltage $V_{dd}$ is supplied to the comparators 21 and the encoder 30.

Next, the variable resistive element rj included in the variable resistor Rv will be described. For example, in the embodiment, the variable resistive element rj includes a magnetoresistive element. The magnetoresistive element is fabricated through a film forming process and a microfabrication process. The magnetoresistive elements which have the same thin film type are almost the same in sheet resistivity. Here, a magnetic tunnel junction (hereinafter, referred to as "MTJ") element is described as an example of the magnetoresistive element. In the following, the variable resistive element rj is referred to as an "MTJ element rj".

Figure 5:
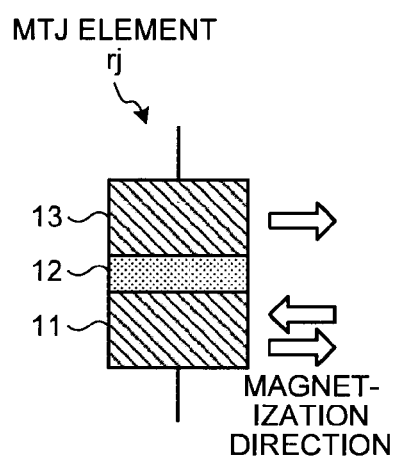
FIG. 5 is a diagram illustrating an exemplary configuration of an MTJ element.
Figure 5:
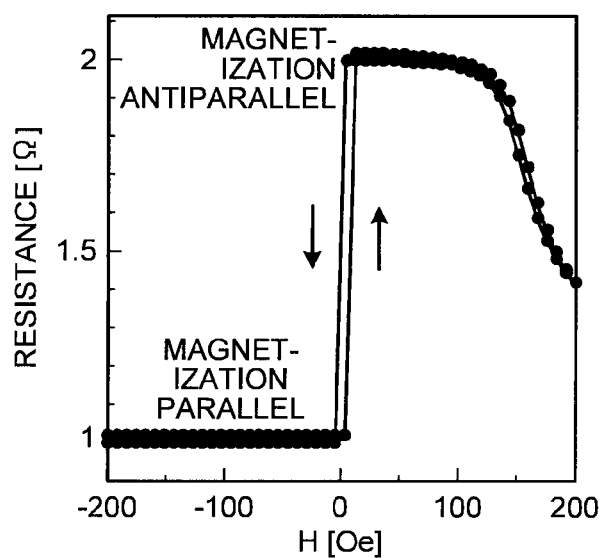

As illustrated in FIG. 5, the MTJ element rj has a three-layer structure of a magnetic film 11, a tunnel insulating film 12, and a magnetic film 13. For example, CoFeB may be employed as the magnetic film 11, MgO may be employed as the tunnel insulating film 12, and CoFeB may be employed as the magnetic film 13.

In the example of FIG. 5, the magnetic film 11 at a lower side is a magnetization free layer in which a magnetization direction is changeable. IrMn which is an antiferromagnetic material is deposited on the magnetic film 13 at an upper side to form a magnetization fixed layer in which a magnetization direction is unchangeable. When the magnetization direction of the magnetization free layer (the magnetic film 11) is the same as the magnetization direction of the magnetization fixed layer (the magnetic film 13) (in case of magnetization parallel), the resistance of the MTJ element rj changes to a low resistance value as illustrated in FIG. 5. However, when the magnetization direction of the magnetization free layer is opposite to the magnetization direction of the magnetization fixed layer (in case of magnetization antiparallel), the resistance of the MTJ element rj changes to a high resistance value as illustrated in FIG. 5. As described above, the resistance value of the MTJ element rj changes to any one of resistance values of two types (a high resistance value and a low resistance value) according to a magnetization state of the MTJ element rj.

A ratio of a resistance value (a low resistance value) at the time of magnetization parallel and a resistance value (a high resistance value) at the time of magnetization antiparallel is called a magnetic resistance ratio (hereinafter, referred to as an "MR ratio") and defined by the following Formula (1):

$$\text{MR ratio} = (\text{high resistance value} - \text{low resistance value})/(\text{low resistance value}) \quad (1)$$

For example, when the resistance value has changed twice with the change from magnetization parallel to magnetization antiparallel (that is, the high resistance value is twice as large as the low resistance value), the MR ratio becomes 100% ("1"). For example, when the resistance value has changed ten times, the MR ratio becomes 900% ("9"). In case of the MTJ element, an element having the MR ratio of 100% at the room temperature can be easily fabricated.

The film thickness of each of the magnetic film 11, the tunnel insulating film 12, and the magnetic film 13 is set to obtain a desired MR ratio. For example, when the film thickness of CoFeB (the magnetic films 11 and 13) is set to about 3 nm and the film thickness of MgO (the tunnel insulating film 12) is set to about 1 nm, sheet resistance RA of about 10 $\Omega\mu m^2$ and the MR ratio of about 100% are obtained. These values change according to a film forming condition and a subsequent heating process, and so a manufacturer needs to set the conditions in advance. However, the MTJ has a feature that reproducibility of the RA or the MR ratio which is obtained once is very high. As illustrated in FIG. 5, the resistance of the MTJ changes depending on an external magnetic field, and the resistance value clearly has a binary state in case of magnetization parallel and in case of magnetization antiparallel.

A material of the magnetic film is not limited to CoFeB and may include an alloy including Fe, Co, or the like. In order to obtain a desired MR ratio, a high spin polarized material such as a Heusler alloy or oxide magnetic material may be used. The tunnel insulating film is not limited to MgO, and a tunnel insulating film such as AlOx may be used as long as a desired MR ratio is obtained. The type of antiferromagnetic film for magnetization fixing is not limited to IrMn, and the free layer and the fixed layer may be turned upside down. A configuration of an MTJ formed in a known MRAM, an HDD read head, or the like may be employed.

Figure 6:
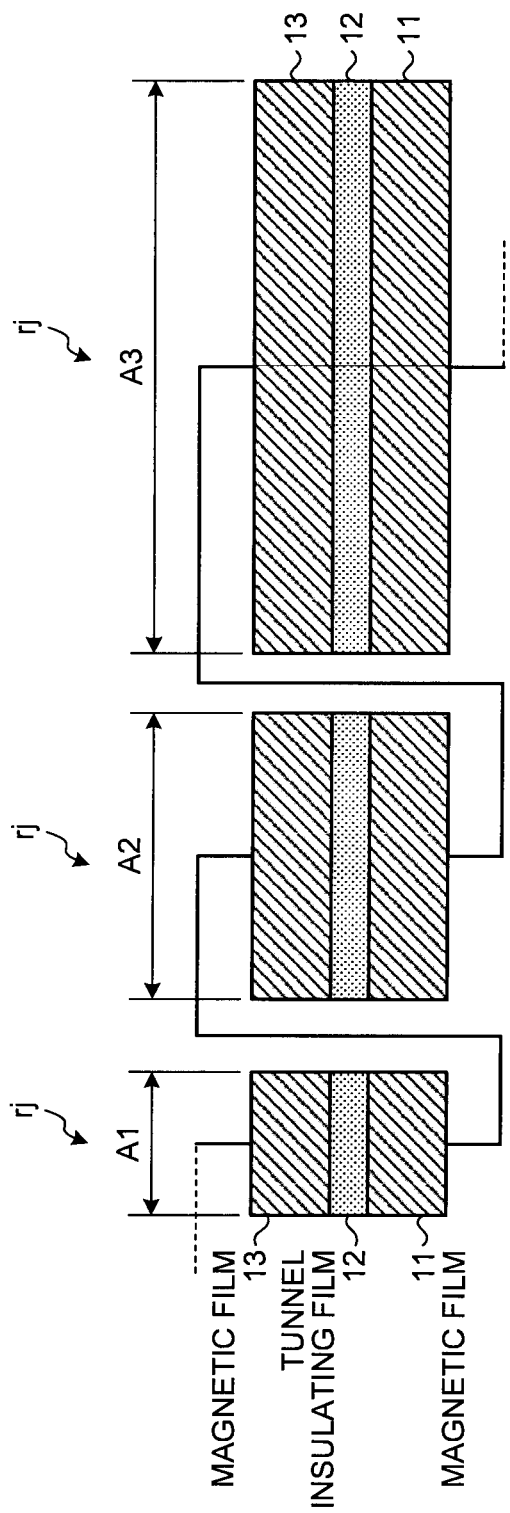
FIG. 6 is a diagram illustrating an example of forming a plurality of MTJ elements.
Figure 7:
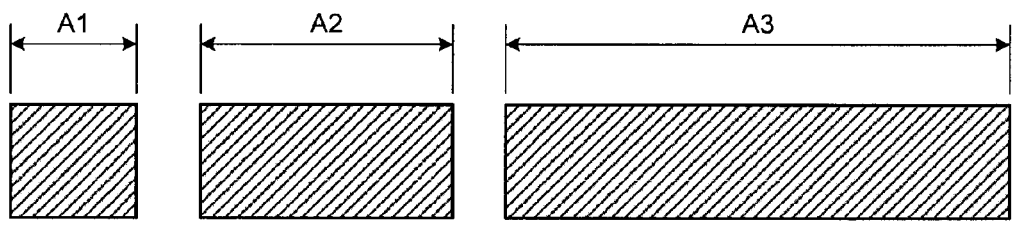
FIG. 7 is a diagram illustrating an example of forming a plurality of MTJ elements.
Figure 8:
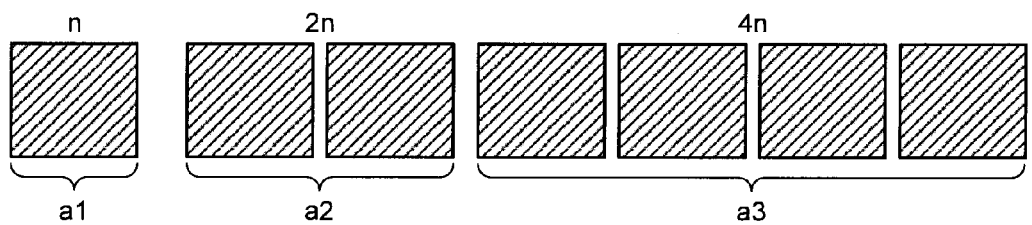
FIG. 8 is a diagram illustrating an example of forming a plurality of MTJ elements.

After deciding the film thickness of each film and performing film formation in the above-described way, a microfabrication process for determining an area size is executed, so that the MTJ elements rj in serial connection are formed. In an example of FIG. 6, MTJ elements rj of three types having different sizes A1, A2, and A3 are formed. Each of the MTJ elements rj is deposited by single film formation. FIG. 7 is a view illustrating a film after processing viewed from the top. In this example, an area of A2 is twice as large as A1, and an area of A3 is four times as large as A1. When the area of A1 is 1, the area of A2 is 2, and the area of A3 is 4. Alternatively, as illustrated in FIG. 8, an area may be defined using the number of a1s using a1 as a unit area. For example, a2 is 2 a1s, and a3 is 4 a1s. In this case, the MTJ elements rj need not necessarily be close to each other up to the limit and may be arranged to keep a distance not to give influence of processing from each other. In this way, influence of a processing variation or a process damage of an edge portion of the MTJ element rj can be suppressed. The MTJ elements rj are connected in series by an interconnection forming process before and after forming the MTJ elements rj (see FIG. 6). In this way, a plurality of MTJ elements rj which have different areas and are connected in series are formed.

Next, a method of adjusting a resistance value of the variable resistors Rv will be described. The rewriting circuit 40 illustrated in FIG. 3 variably sets a resistance value of each of the variable resistors Rv according to an external signal. In the embodiment, when a magnetic field generated due to a current flowing through a corresponding signal line is applied to the MTJ element rj included in the variable resistors Rv, a magnetization state of the MTJ element rj changes (the resistance value changes). The rewriting circuit 40 variably sets the resistance value of the MTJ element rj by controlling a current flowing through the signal line according to an input external signal. A more specific description will be made below.

Figure 9:
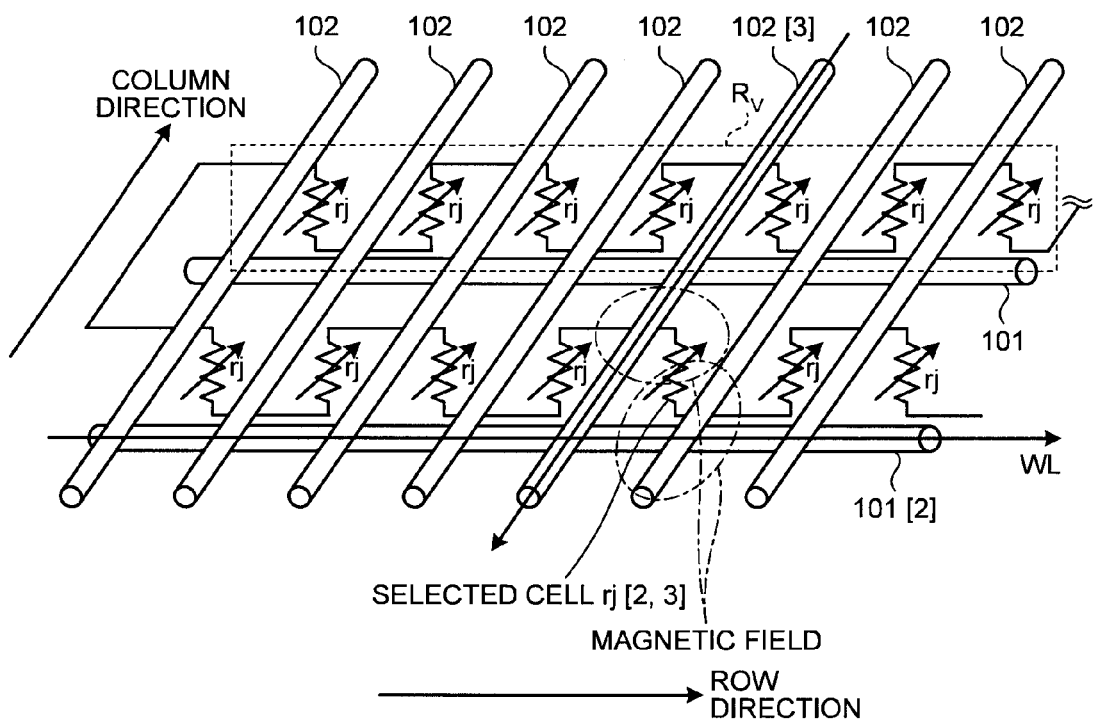
FIG. 9 is a diagram for describing an example of a method of changing a magnetization state of each MTJ element.

As illustrated in FIG. 9, in the embodiment, the plurality of MTJ elements rj are formed corresponding to crossing points of a plurality of word lines 101 which extend in a row direction in parallel and a plurality of bit lines 102 which extend in a column direction in parallel. In the example of FIG. 9, each of a plurality of variable resistors Rv which are connected in series includes 7 MTJ elements rj which are connected in series.

The rewriting circuit 40 changes the magnetization state of the MTJ element rj corresponding to the word line 101 and the bit line 102 by controlling a current (controlling a direction or a value of a current) flowing the word line 101 and the bit line 102 according to an external signal. In this example, when a magnetic field (a magnetic field externally leaking from the word line 101 and the bit line 102) generated due to the current flowing through the corresponding word line 101 and the corresponding bit line 102 is applied to the MTJ element rj, the magnetization state of the MTJ element rj changes.

In the example of FIG. 9, a plurality of MTJ elements rj is arranged in the form of a matrix, but the invention is not limited thereto. For example, a plurality of MTJ elements rj may be formed corresponding to crossing points of one word line 101 and a plurality of bit lines 102. Alternatively, for example, a plurality of MTJ elements rj may be formed corresponding to crossing points of one bit line 102 and a plurality of word lines 101. In other words, it is sufficient if each MTJ element rj may be arranged near the word line 101 and the bit line 102 corresponding to the MTJ element rj, and the magnetization state of the MTJ element rj may be variably controlled when the magnetic field generated due to the current flowing through the word line 101 and the bit line 102 corresponding to the MTJ element rj is applied to the MTJ element rj.

In the example of FIG. 9, a resetting magnetic field is externally applied to each MTJ element rj in advance, and so each MTJ element rj is set (reset) to the magnetization parallel state. For the MTJ element rj for which "magnetization antiparallel" is designated by the input external signal (which will be described later), the rewriting circuit 40 performs control such that a predetermined current flows to each of the word line 101 and the bit line 102 corresponding to the MTJ element rj in question. For example, in FIG. 9, when "magnetization antiparallel" is designated as a magnetization state of an MTJ element rj [2,3] corresponding to a crossing point of a word line 101 [2] of a second row from the top and a bit line 102 [3] of a third column from the right, the rewriting circuit 40 performs control such that a predetermined current flows to each of the word line 101 [2] of the second row and the bit line 102 [3] of the third column as illustrated in FIG. 9. At this time, the magnetic field (synthetic magnetic field) generated due to the current flowing through the word line 101 [2] of the second row and the bit line 102 [3] of the third column is applied to the MTJ element rj [2,3], and so the magnetization state of the MTJ element rj [2,3] changes from magnetization parallel to magnetization antiparallel.

The above-described embodiment is an example, and an arbitrary method may be used to change the magnetization state of the MTJ element rj to the magnetization parallel state or the magnetization antiparallel state. For example, the rewriting circuit 40 may reset (individually reset) the magnetization state of each MTJ element rj to the magnetization parallel state by individually controlling the current flowing through the word line 101 and the bit line 102 without applying a resetting magnetic field from the outside.

The external signal input to the rewriting circuit 40 includes a plurality of control signals that correspond to the plurality of variable resistors Rv in a one-to-one manner. Each of the control signals is represented by a plurality of bits that correspond to the plurality of MTJ elements rj included in the corresponding variable resistors Rv in a one-to-one manner. Each of the MTJ elements rj is set to any one of resistance values (a high resistance value and a low resistance value) of two types according to a bit corresponding to the MTJ element rj in question.

Figure 10:
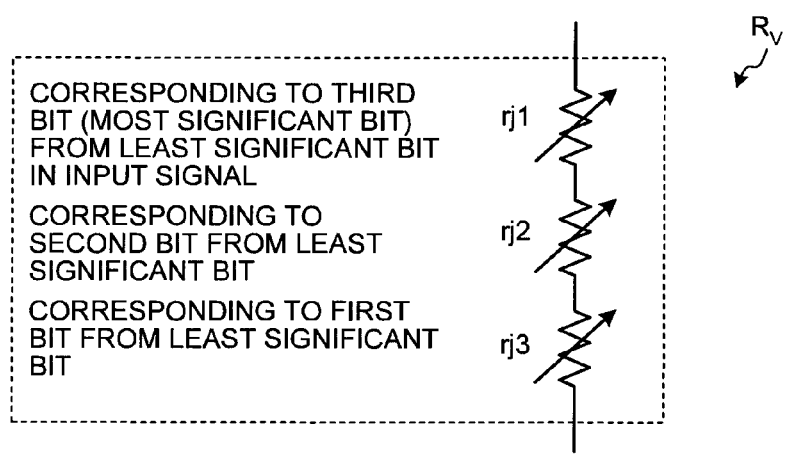
FIG. 10 is a diagram illustrating an example of a variable resistor.

Now, an example in which one variable resistors Rv includes three MTJ elements rj1 to rj3 which are connected in series as illustrated in FIG. 10 will be described. In the example of FIG. 10, it is assumed that the size of the MTJ element rj1 (an area value of a film forming the MTJ element) is A1, the size of the MTJ element rj2 is A2, and the size of the MTJ element rj3 is A3. Since the resistance value is in inverse proportion to the area value, when the MTJ elements rj1 and rj2 have the same magnetization state, the resistance value of the MTJ element rj1 is twice as large as the resistance value of the MTJ element rj2. Further, the resistance value of the MTJ element rj1 is four times as large as the resistance value of the MTJ element rj3.

The control signal corresponding to the variable resistor Rv illustrated in FIG. 10 is represented by 3 bits, a third bit from a least significant bit (a most significant bit) corresponds to the MTJ element rj1 having the largest resistance value. Further, a second bit from a least significant bit corresponds to the MTJ element rj2 having the second largest resistance value. Further, a first bit from a least significant bit corresponds to the MTJ element rj3 having the smallest resistance value.

According to the control signal of 3 bits corresponding to the variable resistor Rv of FIG. 10, the rewriting circuit 40 variably sets the resistance value of the variable resistors Rv. In the example of FIG. 10, when a bit corresponding to the MTJ element rj is "1", since "magnetization antiparallel" is designated as the magnetization state of the MTJ element rj, the rewriting circuit 40 controls the current flowing through the word line 101 and the bit line 102 such that the magnetization state of the MTJ element rj changes to magnetization antiparallel. As a result, the resistance value of the MTJ element rj is set to a high resistance value. When a bit corresponding to the MTJ element rj is "0", since "magnetization parallel" is designated as the magnetization state of the MTJ element rj, the rewriting circuit 40 controls the current flowing through the word line 101 and the bit line 102 such that the magnetization state of the MTJ element rj changes to magnetization parallel. As a result, the resistance value of the MTJ element rj is set to a low resistance value. However, the embodiment is not limited to this example. For example, when a bit corresponding to the MTJ element rj is "1", "magnetization parallel" may be designated as the magnetization state of the MTJ element rj, whereas when a bit corresponding to the MTJ element rj is "0", "magnetization antiparallel" may be designated as the magnetization state of the MTJ element rj. In other words, there is no problem if each MTJ element rj is set to any one of resistance values of two types (a high resistance value and a low resistance value) according to the bit corresponding to the MTJ element rj.

The resistance value of the variable resistor Rv of FIG. 10 is represented by the following Formula (2):

$$\text{Resistance value} = Rp \times \Sigma(1 + MR \text{ ratio} \times aj) \times 2^N \quad (2)$$

In Formula (2), Rp represents sheet resistance in case of magnetization parallel. Further, aj represents a magnetization state of an MTJ element rj corresponding to a j-th bit (in this example, $1 \leq j \leq 3$) from a least significant bit. aj is set to "0" in case of magnetization parallel but to "1" in case of magnetization antiparallel. N (in this example, $0 \leq N \leq 2$) represents a bit position (weight). For example, it is assumed that Rp is 1Ω per unit area, the MR ratio is 100%, and the control signal corresponding to the variable resistors Rv of FIG. 10 is "101". In this case, the rewriting circuit 40 controls the current flowing the word line 101 and the bit line 102 such that the magnetization state of the MTJ element rj1 becomes "magnetization antiparallel", the magnetization state of the MTJ element rj2 becomes "magnetization parallel", and the magnetization state of the MTJ element rj3 becomes "magnetization antiparallel". The resistance value of the variable resistor Rv of FIG. 10 becomes 12Ω ($=1\times\{(1+100\%\times1)\times2^2+(1+100\%\times0)\times2^1+(1+100\%\times1)\times2^0\}$).

Figures 11, 12:
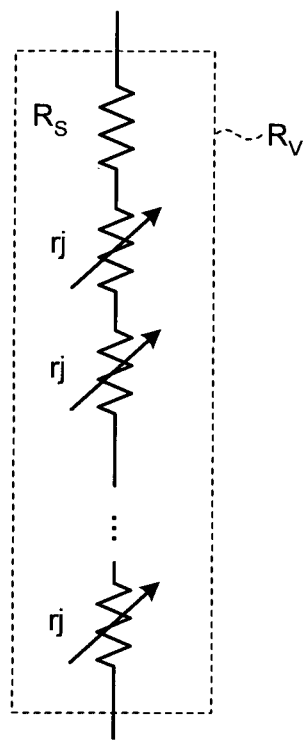
FIG. 11 is a diagram illustrating an example of a correspondence relation between a control signal and a resistance value.
FIG. 12 is a diagram illustrating a modification of a variable resistor.

As described above, the resistance value of the variable resistor of FIG. 10 is variably set according to the control signal of 3 bits. FIG. 11 is a diagram illustrating a correspondence relation between the control signal of 3 bits and the resistance value of the variable resistor Rv. In this example, by adjusting the control signal of 3 bits, the resistance value of the variable resistor Rv can be adjusted in a stepwise manner.

As described above, in the embodiment, the resistor ladder of the AD converter 100 includes a plurality of variable resistors Rv each having a resistance value variably set according to the external signal. Thus, the resistance value can be adjusted even after the AD converter is fabricated. Further, each of the variable resistors Rv includes a plurality of MTJ elements rj which is connected in series, and each of the MTJ elements rj has a resistance value variably set according to the external signal (the control signal). Thus, the resistance value of each of the variable resistors Rv can be adjusted in a stepwise manner. Therefore, since the voltage dividing accuracy of the resistor ladder can be improved without providing a fuse or the like, the conversion accuracy of the AD converter 100 can be improved while suppressing an increase in the circuit size.

Further, in the embodiment, the films forming the plurality of individual MTJ elements rj included in the variable resistor Rv are different in the area value (different in the resistance value). Thus, compared to a case where the films forming a plurality of individual MTJ elements rj included in the variable resistor Rv are set to have the same area value, there is an advantage that the resistance value of the variable resistor Rv can be adjusted in a more stepwise manner.

Next, modifications will be described. The modifications described below may be arbitrarily combined.

(1) First Modification

In the above-described embodiment, each variable resistor Rv includes a plurality of variable resistive elements (for example, MTJ elements) rj which are connected in series, but the invention is not limited thereto. For example, each variable resistor Rv may include a fixed resistor Rs made of poly crystalline silicon and a plurality of variable resistive elements rj which are connected in series as illustrated in FIG. 12. In other words, there is no problem if each variable resistors Rv includes a plurality of variable resistive elements which are connected in series, and each of the variable resistive elements has a resistance value variably set according to an external signal. For example, it is assumed that, in order to achieve 1.1 k$\Omega$ as the resistance value of the variable resistor Rv in FIG. 12, poly crystalline silicon (the fixed resistor Rs) of 1 k $\Omega$ is combined with a plurality of variable resistive elements rj whose total resistance value is set to 1$\Omega$. In this case, even if it is found that poly crystalline silicon has a processing variation of 1% and the variable resistor Rv has the resistance value of 999$\Omega$ after fabrication, by setting the external signal so that the resistance value of the plurality of variable resistive elements rj can change from 1$\Omega$ to 2$\Omega$, the total resistance value of the variable resistor Rv can be set to 1.1 k$\Omega$.

(2) Second Modification

In the above-described embodiment, the example in which the variable resistive element rj is an MTJ element has been described, but the invention is not limited thereto. For example, the variable resistive element rj may be a GMR (giant magneto resistance) element. The GMR element is different from the MTJ element in that a non-magnetic film is used instead of the tunnel insulating film. In other words, the GMR element has a three-layer structure of a magnetic film, a non-magnetic film, and a magnetic film. For example, Co may be employed as the magnetic film, and Cu may be employed as the non-magnetic film. A material of the magnetic film is not limited to Co, but a magnetic film made of a general alloy containing Fe or Co or a high spin polarized material such as a Heusler alloy or oxide magnetic material may be used. A material of the non-magnetic film is not limited to Cu, and for example, Ag, Cr, or the like may be employed. That is, a configuration of a GMR element formed in a conventional HDD read head or the like may be employed.

Figure 13:
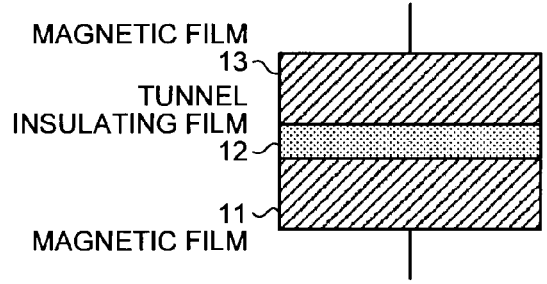
FIG. 13 is a diagram illustrating an example of an I-V characteristic of an MTJ element.
Figure 13:
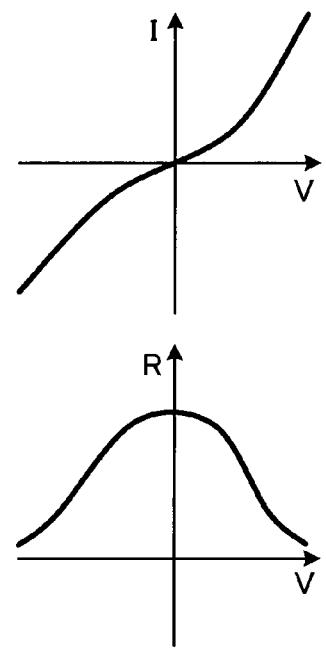
Figure 14:
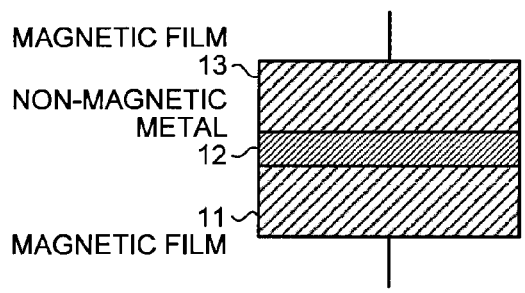
FIG. 14 is a diagram illustrating an example of an I-V characteristic of a GMR element.
Figure 14:
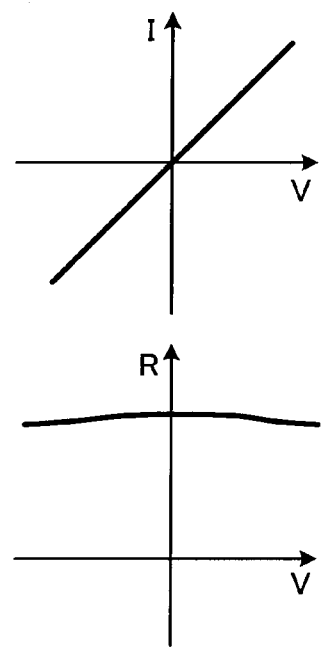

Meanwhile, the MTJ element has a non-linear I-V characteristic as illustrated in FIG. 13 since the tunnel current flows. On the other hand, the GMR element has a linear I-V characteristic as illustrated in FIG. 14. In the above-described embodiment, since the two or more MTJ elements are connected in series, a divided voltage applied to one MTJ element is reduced and so non-linearity is mitigated. However, for example, when the analog input signal has a high frequency and so non-linearity of the I-V characteristic becomes problematic, it is desirable to use the GMR element instead of the MTJ element. As a result, the linear I-V characteristic of FIG. 14 is obtained. Further, since the MJT element utilizes the tunnel resistance, an absolute value of the resistance value thereof depends on the thickness of the tunnel insulating film in an exponential manner. On the other hand, the GMR element in which each layer is formed of a metallic film can easily obtain a low resistance. However, since the GMR element is smaller in the MR ratio than the MTJ element, the MR ratio needs to be increased using a magnetic thin film having a high spin polarization ratio such as a Heusler alloy.

In other words, the type of magnetoresistive element used as the variable resistive element rj is arbitrary. Using a magnetoresistive element whose resistance value changes to any of two values according to the magnetization state like the MTJ element or the GMR element, digital control for variably controlling the resistance value of the variable resistor Rv can be implemented.

(3) Third Modification

Figure 15:
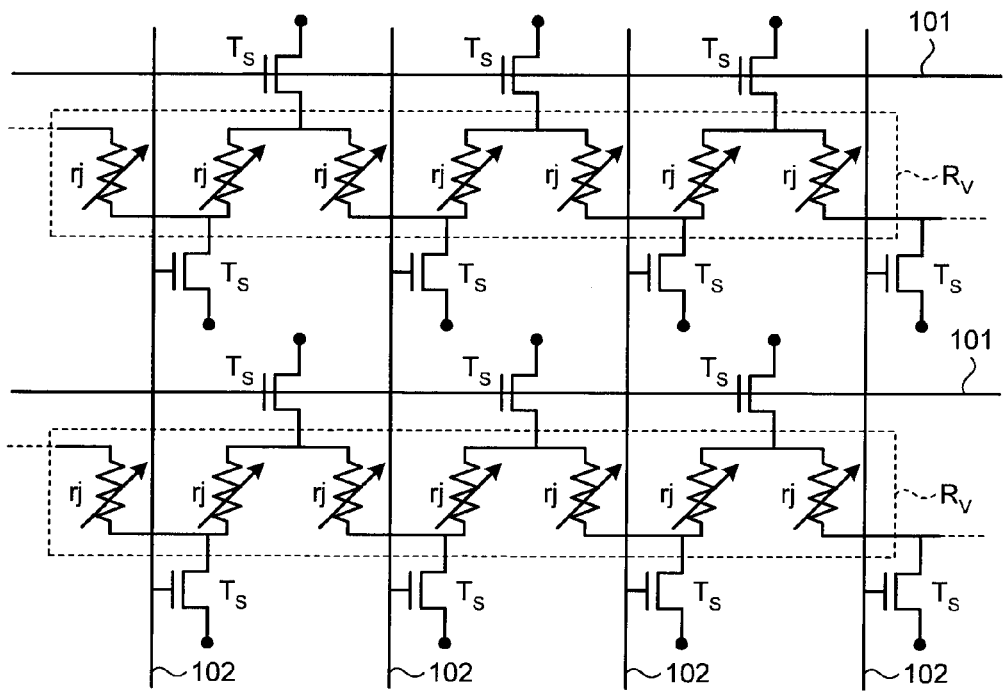
FIG. 15 is a diagram for describing a case in which a spin injection magnetization reversal technique is employed.

A method of variably controlling the magnetization state of the MTJ element (the magnetoresistive element) is arbitrary. For example, a spin-injection magnetization reversal technique may be used that changes the magnetization state of the MTJ element by controlling a magnitude or a direction of a current supplied to the MTJ element. When the spin-injection magnetization reversal technique is employed, selective transistors Ts for selectively supplying a current to the MTJ elements are provided as illustrated in FIG. 15. In this example, the rewriting circuit 40 controls on/off of each of the selective transistor Ts according to an external signal, and the magnetization state (resistance value) of the MTJ element changes according to the current supplied through the selective transistor Ts which is switched to an on state. A more specific description will be made below.

Figure 16:
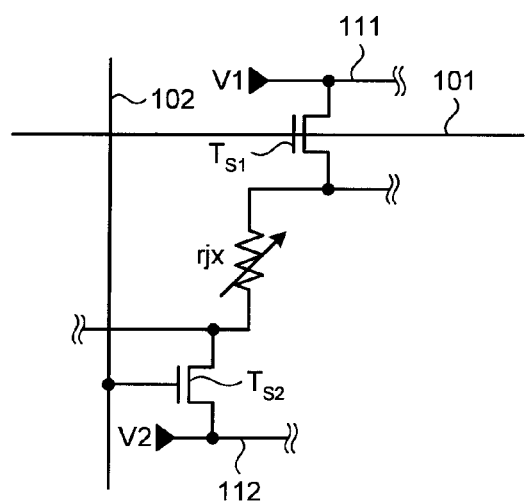
FIG. 16 is a diagram for describing a specific MTJ element.

Next, a description will be made in connection with a specific MTJ element rjx as illustrated in FIG. 16. As illustrated in FIG. 16, a first selective transistor Ts1, a specific MTJ element rjx, and a second selective transistor Ts2 are connected in series between a first power line 111 to which first potential V1 is applied and a second power line 112 to which second potential V2 is applied. The first selective transistor Ts1 is arranged between the first power line 111 and the MTJ element rjx. A gate of the first selective transistor Ts1 is connected to a word line 101 corresponding to the MTJ element rjx. The second selective transistor Ts2 is arranged between the second power line 112 and the MTJ element rjx. A gate of the second selective transistor Ts2 is connected to a bit line 102 corresponding to the MTJ element rjx. In other words, the selective transistors Ts are means for performing switching whether to supply a current from the power lines (111 and 112) to the MTJ element rjx.

The rewriting circuit 40 (not illustrated) changes magnetization state of the MTJ element rjx by controlling supply of the current to the MTJ element rjx. For example, it is assumed that a current of a predetermined magnitude flowing from the first power line 111 to the second power line 112 is supplied to the MTJ element rjx. In this case, the rewriting circuit 40 first selects a word line 101 and a bit line 102 corresponding to the MTJ element rjx. As a result, the first selective transistor Ts1 and the second selective transistor Ts2 transit to the on state, and so a current path from the first power line 111 to the second power line 112 through the MTJ element rjx is formed. The rewriting circuit 40 then sets values of the first potential V1 and the second potential V2 so that the current of the predetermined magnitude can flow from the first power line 111 to the second power line 112 (in this case, V1>V2). As a result, the current of the predetermined magnitude flowing from the first power line 111 to the second power line 112 is supplied to the MTJ element rjx, and so the magnetization state of the MTJ element rjx changes according to the current.

Further, for example, it is assumed that a current of a predetermined magnitude flowing from the second power line 112 to the first power line 111 is supplied to the MTJ element rjx. In this case, the rewriting circuit 40 first selects a word line 101 and a bit line 102 corresponding to the MTJ element rjx. The rewriting circuit 40 then sets values of the first potential V1 and the second potential V2 so that the current of the predetermined magnitude can flow from the second power line 112 to the first power line 111 (in this case, V2>V1). As a result, the current of the predetermined magnitude flowing from the second power line 112 to the first power line 111 is supplied to the MTJ element rjx, and so the magnetization state of the MTJ element rjx changes according to the current.

For example, when "magnetization antiparallel" is designated as the magnetization state of the MTJ element rjx according to an external signal, the rewriting circuit 40 controls on/off of the first selective transistor Ts1 and the second selective transistor Ts2 and controls the potentials of the first power line 111 and the second power line 112 such that the magnetization state of the MTJ element rjx changes to "magnetization antiparallel". Further, for example, when "magnetization parallel" is designated as the magnetization state of the MTJ element rjx according to an external signal, the rewriting circuit 40 controls on/off of the first selective transistor Ts1 and the second selective transistor Ts2 and controls the potentials of the first power line 111 and the second power line 112 such that the magnetization state of the MTJ element rjx changes to "magnetization parallel". Here, the specific MTJ element rjx has been described as an example, but another MTJ element rj can be similarly applied. The configuration of FIGS. 15 and 16 is an example, and the connection method of the word line 101 and the bit line 102 is not limited thereto. In other words, it is sufficient if a configuration in which the magnetization state of the MTJ element rj is variably set by selectively supplying the current to the MTJ element rj is employed.

(4) Fourth Modification

Figure 17:
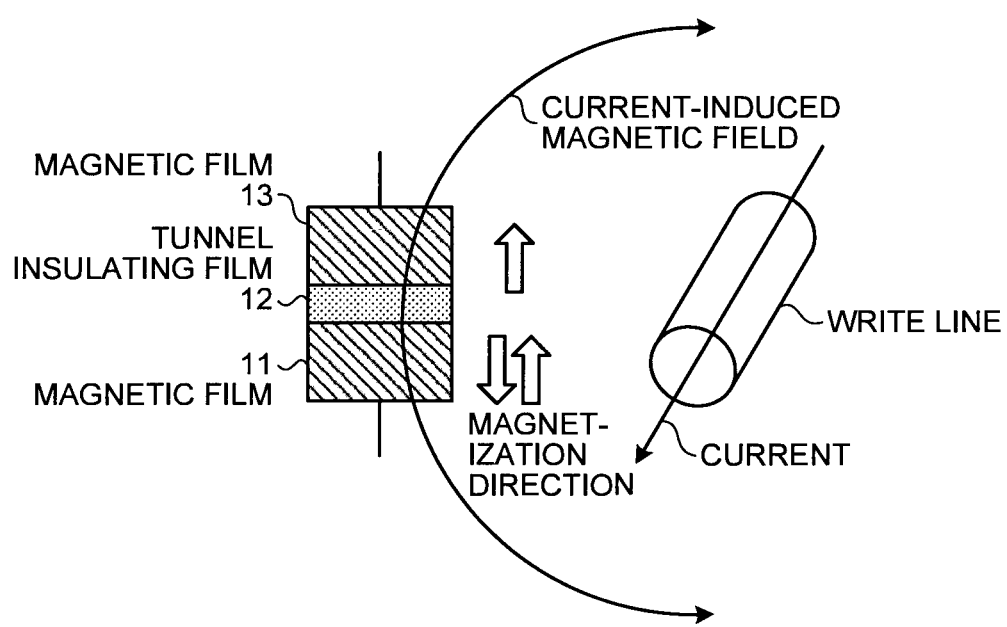
FIG. 17 is a diagram illustrating a modification of an MTJ element.

Any magnetic film may be included in the MTJ element. For example, a thin film having vertical magnetization may be used as the magnetic film as illustrated in FIG. 17. In this case, a vertical film in which Co or Fe contains Pt or Pd may be employed as the magnetic film, and a vertical film containing Gd, Tb, or the like may be employed as the magnetic film. As a method of variably controlling the magnetization state, a method may be employed in which the magnetization state of the MTJ element is changed by varying a magnitude or a direction of a current flowing through a write line arranged near the MTJ element as illustrated in FIG. 17. That is, by applying a magnetic field (a magnetic field externally leaking from the write interconnection) generated due to the current flowing through the writ line to the MTJ element, it is possible to change the magnetization state of the MTJ element. The configuration is not limited thereto, and for example, the magnetization state of the MTJ element can be varied by the above-described spin injection magnetization reversal technique.

(5) Fifth Modification

In the above-described embodiment, films forming a plurality of individual MTJ elements rj included in the variable resistor Rv are different in the area value (different in the resistance value). However, the invention is not limited thereto, and films forming a plurality of individual MTJ elements rj included in the variable resistor Rv may be set to have the same area value. However, when a configuration is employed in which films forming a plurality of individual MTJ elements rj included in the variable resistor Rv are different in the area value as in the above-described embodiment, the resistance value of the variable resistor Rv can be adjusted in a more stepwise manner compared to a configuration in which films forming a plurality of individual MTJ elements rj is set to have the same area value.

(6) Sixth Modification

In the above-described embodiment, the example has been described in which the MTJ element which is a magnetoresistive element is used as the variable resistive element rj included in the variable resistor Rv. However, the invention is not limited thereto, and the type of an element employed as the variable resistive element rj is arbitrary. In other words, there is no problem if each of the plurality of variable resistors Rv includes a plurality of variable resistive elements rj which is connected in series, and each of the variable resistive elements rj has a resistance value variably set according to an external signal. And there is no problem if each of a plurality of control signals constituting an external signal input to the rewriting circuit 40 is represented by a plurality of bits which correspond to a plurality of variable resistive elements rj included in the corresponding variable resistor Rv in a one-to-one manner, and each variable resistive element rj is set to any one of resistance values of two types according to a bit corresponding to the variable resistive element rj. Further, the number of variable resistive elements rj included in each variable resistive element Rv is arbitrary and may be determined depending on the resolution of the AD converter 100 desired to manufacture.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An analog-to-digital converter, comprising:
a voltage generating unit including a plurality of variable resistors, wherein:
the voltage generating unit is configured to divide a reference voltage by the variable resistors to generate a plurality of comparative voltages,
each of the variable resistors includes no switch,
each of the variable resistors includes a plurality of variable resistive elements connected in series,
each of the variable resistive elements is configured to change between two resistance values according to an external signal; and
a plurality of comparators each configured to compare one of the plurality of comparative voltages with an analog input voltage and output a digital signal based on a result of a comparison between the comparative voltage and the analog input voltage,
wherein:
the external signal includes a plurality of control signals, each of the control signals corresponding to one of the variable resistors,
each of the control signals is represented by a plurality of bits, each of the bits corresponding to one of the variable resistive elements included in the corresponding variable resistor in a one-to-one manner, and each of the variable resistive elements is set to one of the resistance values according to the bit corresponding to the corresponding variable resistive element.

2. The converter according to claim 1,
wherein films forming the plurality of variable resistive elements included in the variable resistor are different in area value.

3. The converter according to claim 1,
wherein the variable resistive element is a magnetoresistive element.

4. The converter according to claim 3,
wherein the magnetoresistive element is a magnetic tunnel junction element.

5. The converter according to claim 3,
wherein the magnetoresistive element is a giant magneto resistance element.

6. The converter according to claim 3, further comprising a rewriting circuit configured to variably set a resistance value of the magnetoresistive element according to the external signal,
wherein a magnetization state of the magnetoresistive element changes when a magnetic field generated by a current flowing through a corresponding signal line is applied to the magnetoresistive element, so that a resistance value of the magnetoresistive element changes, and
the rewriting circuit controls the current flowing through the signal line according to the external signal.

7. The converter according to claim 3, further comprising:
a rewriting circuit configured to variably set a resistance value of the magnetoresistive element according to the external signal; and
a selective transistor configured to perform switching whether to supply a current from a power line to the magnetoresistive element,
wherein a magnetization state of the magnetoresistive element changes with a current supplied through the selective transistor that is switched to an on state, so that the resistance value of the magnetoresistive element changes, and
the rewriting circuit controls on/off of the selective transistor according to the external signal.

* * * * *